United States Patent [19]

Cross et al.

[11] Patent Number: 4,825,154

[45] Date of Patent: Apr. 25, 1989

[54] CURRENT PROBE

[75] Inventors: Geoffrey Cross, Merseyside; Brian Hargreaves, Warrington, both of England

[73] Assignee: Pilkington Brothers PLC, England

[21] Appl. No.: 11,019

[22] Filed: Feb. 5, 1987

[30] Foreign Application Priority Data

Feb. 15, 1986 [GB] United Kingdom ............... 8603781

[51] Int. Cl.4 .................. G01R 1/073; G01R 19/00
[52] U.S. Cl. .................... 324/127; 324/117 R; 324/149
[58] Field of Search ............ 324/117 R, 117 H, 127, 324/129, 149, 72.5; 188/83, 290, 134; 267/57, 59, 8 R; 336/176; 16/62, 64, 85

[56] References Cited

U.S. PATENT DOCUMENTS

| 4,052,888 | 10/1977 | Brown et al. | 73/625 |
| 4,115,897 | 9/1978 | Zimkel | 16/62 |
| 4,152,390 | 5/1979 | Nosco et al. | 422/63 |
| 4,234,863 | 11/1980 | Shumway et al. | 324/127 |
| 4,283,677 | 8/1981 | Niwa | 324/127 |
| 4,316,142 | 2/1982 | Kuramoto | 324/127 |
| 4,467,198 | 8/1984 | Joffe et al. | 250/308 |
| 4,620,151 | 10/1986 | Landre | 324/127 |
| 4,635,055 | 1/1987 | Fernandes et al. | 324/127 |

FOREIGN PATENT DOCUMENTS

| 822570 | 11/1951 | Fed. Rep. of Germany . | |
| 2170303 | 12/1971 | France . | |
| 2334112 | 7/1977 | France | 324/149 |
| 2538556 | 6/1984 | France | 324/127 |
| 1481263 | 7/1977 | United Kingdom | 324/127 |

Primary Examiner—Reinhard J. Eisenzopf
Assistant Examiner—W. Burns
Attorney, Agent, or Firm—F. Eugene Davis, IV

[57] ABSTRACT

A current probe is provided which comprises a handle and a ring of magnetisable material for positioning around an electrical conductor, the ring being split into two portions one being fixed relative to the handle and the other being slidable therewithin between a position in which the ring is closed and a position in which the ring is open. The line of split of the ring is at an angle from the line of sliding movement of the linearly slidable portion. Damping is provided to prevent the slidable portion of the ring from too rapidly moving from a position in which the ring is open to a position in which the ring is closed.

2 Claims, 1 Drawing Sheet

CURRENT PROBE

BACKGROUND OF THE INVENTION

This invention relates to a current probe of the type used for remotely detecting electrical current flowing through a conductor which may, for example, form part of a wiring loom of an automobile.

One conventional type of current probe utilises the Hall-effect and is disclosed in U.K. patent No. 2099159B. The probe has a body portion adapted to be gripped by the hand of an operator and at one end of the body portion is hingeably mounted a pair of jaws which together define a ring of magnetisable material. The jaws are movable between an open position in which they can be placed over an electrical conductor and a closed position in which the jaws meet around a conductor and the ring is substantially complete. Whilst this type of probe is perfectly satisfactory for measuring current flowing in an electrical conductor which is readily accessible, it will be appreciated that where the electrical conductor is disposed in a confined space or is amongst several other conductors, it can be difficult, if not impossible, to attach the probe satisfactorily since the opened jaws of the probe can become snagged.

A further problem arises where the electrical conductor is in such a position that in order to take a satisfactory measurement, the conductor must be pulled towards the operator. With a probe having hinged jaws this can lead to slippage and although this can be overcome to some extent by e.g. incorporating a strong spring within the probe to permanently bias the jaws into a closed position, nevertheless it will be appreciated that this arrangement is far from satisfactory since it then makes the jaws difficult to open unless a mechanical advantage is incorporated into the trigger mechanism.

The above problems are overcome to a limited extent by another probe known in the art which has, instead of hinged jaws, an arrangement in which a rectangular ring of magnetisable material is mounted on the end of a handle-shaped body. One side of the ring is split from the remaining three sides and is slidable within the handle of the probe to thereby permit access into the ring of a conductor. The slidable side of the ring is urged back to a position in which the ring is complete by means of a compression spring held within the handle.

One problem with this second kind of probe known in the art is that the biassing spring acts only along the line of sliding movement because the line of the split is parallel to the line of sliding movement. This in turn means that when the ring is complete additional spring means must be provided to ensure that a good contact is made between the sliding part of the ring and the fixed part. Another disadvantage results from the rectangular shape of the ring of magnetisable material, which shape tends to introduce into the probe signal errors as a result of the consequential assymetry in the magnetic circuit which, ideally, should be generally circular. The rectangular configuration has a further disadvantage, particularly in a Hall-effect proble, in that it is generally not as easy to manufacture as a circular ring, since, if used, the windings that make up the rectangular ring must have a discontinuity at each respective corner of the ring. A still further disadvantage is that unwanted space is taken up by the presence of the sliding part of the ring and the presence of the spring means biassing the sliding part of the ring into good contact with the remaining part of the ring. The problem is not as severe as with a probe of the type in which the jaws are hingeable, but on the other hand the problem is not negligible either.

It is an object of the present invention to provide a current probe in which te aforementioned disadvantages are obviated, the probe being of itself a significant improvement in the art.

SUMMARY OF THE INVENTION

According to the invention there is provided a current probe having handle means and a ring of magnetisable material for positioning around an electrical conductor, the ring being split into two portions, one being fixed relative to the handle means, the other being linearly slidable between a position in which the ring is closed and a position in which the ring is open, the line of split of the ring being at an angle from the line of sliding movement of the linearly slidable portion.

Preferably, the linearly slidable portion of the ring is biassed by means which also act to bias the respective faces, formed by the split, of the linearly slidable portion against the corresponding faces of the fixed portion of the ring.

The ring is conveniently, though not necessarily, circular such that magnetic assymetry and difficulties in manufacture are kept to a minimum. The biassing means may comprise one or more compression springs disposed within the handle means which serve to bias a slidable support towards the ring end of the handle means, to thereby urge the linearly slidable portion of the ring into contact with the fixed portion. The slidable portion of the ring may be permanently fixed to the slidable support and embedded in a jaw element. The fixed portion may be similarly embedded in a jaw element, the two jaw elements together defining openable jaws.

The slidable support may be movable within the body of the handle means by means of a thumb-actuated trigger connected to the support and slidable along a slot in the handle means.

The probe may be provided with damping means to prevent the slidable portion of the ring from too rapidly moving from a position in which the ring is open to a position in which the ring is closed. The damping means may conveniently be connected to the slidable support, which support may be provided with a toothed rack geared to a spur gear and dashpot mounted on a dashpot support plate fixed to the handle means. Such damping means provides controlled closure of the slidable portion of the ring which is an important feature preventing damage of the contacting faces of the respective rings and also preventing or inhibiting signal errors in the magnetic circuit when the probe is in use, the errors being otherwise possible as a result of a disturbance in the magnetic field due to the shock of violent closure of the ring.

BRIEF DESCRIPTION OF THE DRAWINGS

The invention will now be described, by way of example only, with reference accompanying drawings in which.

DETAILED DESCRIPTION OF THE INVENTION

Figure 1:
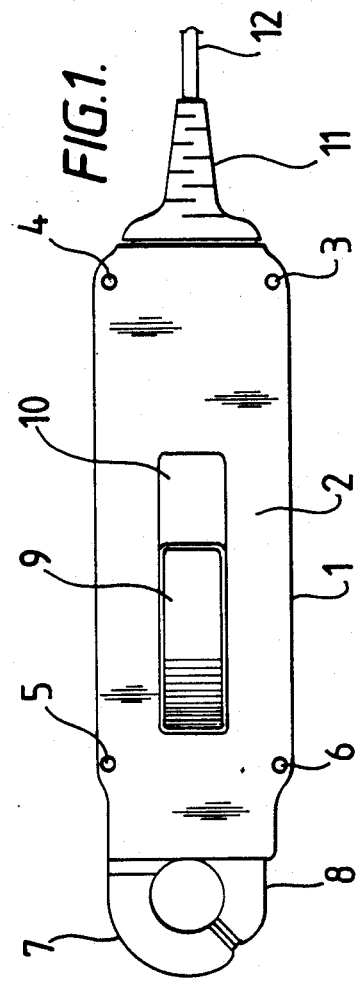
FIG. 1 is a front view of a probe in which the jaws are in a closed position.

Referring firstly to FIG. 1 the probe comprises handle means in the form of a handle body 1 and a cover plate 2 secured to the handle body by four screws 3, 4, 5 and 6. At one end of the body 1 are a pair of jaws 7, 8 which each include a respective portion of a ring of magnetisable material, to be described in FIG. 2. Jaws 7 and 8 are shown in a closed position but are openable by slidably retracting inner jaw 8 into the handle body 1 by means of thumb pressure on a trigger 9 slidable within a slot 10 in the cover plate 2. At the end of the handle body remote from the jaws 7 and 8 is a flexible strain release member 11 of conventional type which reduces strain upon an electrical cable 12 only part of which is shown. As can be seen from FIG. 1, the handle body 1 extends in a longitudinal direction between a proximal and distal end thereof. As also apparent from the drawings, when jaws 7, 8 are closed, the center of the ring defined by ring portions 13 and 14 lies outside the handle body 1.

Figure 2:
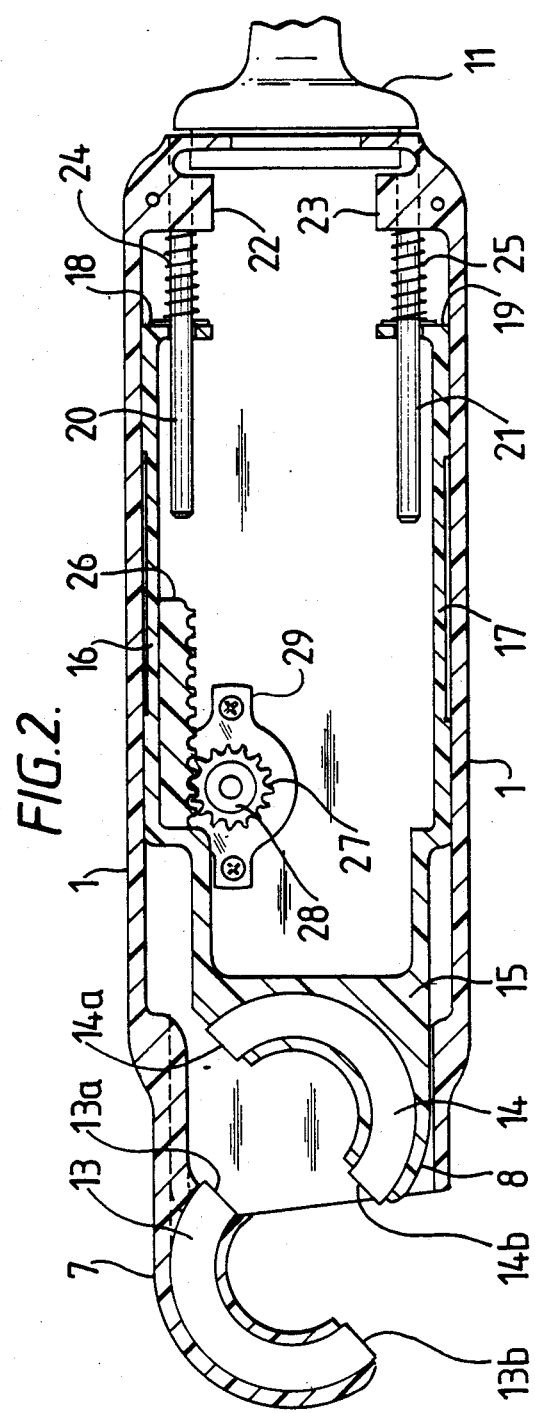
FIG. 2 is an enlarged sectional view of the probe of FIG. 1 in which the jaws are in an open position.

Referring now to FIG. 2 of the drawings, an enlarged sectional view of the probe of FIG. 1 is shown, but in which it will be seen that the inner jaw 8 has been retracted within the handle body 1 to form an opening within which a cable, not shown, can be inserted.

Embedded in the outer jaw 7 is a circular portion 13 of a ring of magnetisable material. A correspondingly shaped portion 14 is embedded in the inner jaw 8 and portions 13, 14 together define a complete ring of magnetisable material when the inner jaw 8 is in abutment with the outer jaw 7, as shown in FIG. 1. As illustrated by the drawings, the respective end faces 13a and 13b of ring portion 13, and the respective end faces 14a and 14b of ring portion 14 are spaced in a direction oblique to the longitudinal direction of the handle body 1, and the inner jaw portion 8 is linearly slidable in said longitudinal direction.

The inner jaw 8 is integral with one end of a slidable support 15 having a pair of elongate webs 16, 17 which slidingly engage respective inner sides of the handle body 1. At the end of each web 16, 17 is a respective foot portion 18, 19, each foot portion having an aperture for receiving a respective spindle 20, 21. Each spindle 20, 21 is fixed into a respective support block 22, 23 integral with the handle body 1 adjacent the strain release member 11. Compression springs 24, 25 are provided around the spindles 20, 21 between each respective support block 22, 23 and each respective foot 18, 19. Compression springs 24, 25 bias the slidable support 15 and hence inner jaw 8 to a closed position as shown in FIG. 1. As evident from FIGS. 1 and 2, the bias is in the longitudinal direction of the handle body 1.

Damping means are incorporated into the probe in order to prevent or inhibit violent closure of the jaws 7, 8 as a consequence of the spring bias. The damping means includes a toothed rack 26 fixed to the upper web 16 of the slidable support 15, the rack 26 being geared to a spur gear 27 mounted on a pinion 28 secured for rotation on a support plate 29 which is fixed to the inner side of the handle body 1 by screws. The pinion 28 includes a dashpot (not shown) of conventional type which limits the speed of rotation of the spur gear 27 such that sliding movement of the slidable support 15 within the handle body 1 is achieved in a damped, controlled manner and hence closure of the inner jaw 8 with respect to the outer jaw 7 is also achieved in a damped, controlled manner. This ensures that the respective end faces 13a, 13b and 14a and 14b of the respective portions 13, 14 of the ring of magnetisable material do not violently collide when the ring is closed, which would otherwise be the case in the absence of the damping means.

A further advantage is that since closure is achieved in a controlled manner little or no shock is imparted to the respective portions 13, 14 making up the magnetic circuit and this in turn reduces signal errors in the probe. This feature is important in Hall-effect probes because they normally incorporate electronic zeroing means which compensate for inherent signal errors in the probe just prior to positioning the probe around a conductor to be measured. This zeroing cannot be done when the probe is actually in position around the conductor since any current flowing therein would interfere with the electronics carrying out the zeroing function. It will therefore be appreciated that if after zeroing the ring is subjected to a severe shock, the magnetic circuit can be altered and an error can therefore arise in the measurement being taken. Such an error is reduced or eliminated by the damping means because the shock of closure of the jaws 7, 8 is reduced or eliminated.

In operation, the jaws 7, 8 of the probe are moved to the open position shown in FIG. 2 by sliding the trigger 9 within the slot 10 to a position in which it is nearest the strain release member 11. The open jaws are then placed around a conductor to be measured and the trigger 9 is then released. The compression springs 24, 25 then urge the slidable support 15 and hence the inner jaw 8 to a closed position, corresponding to that of FIG. 1, and the damping means ensures that the closure is achieved in a controlled manner.

The arrangement thus provides a probe which is extremely convenient to use, especially in confined spaces, and which also allows a conductor to be "hooked" by the outer jaw 7, if necessary, and pulled to a position in which satisfactory measurement can be obtained. It will also be seen that the compression springs 24, 25, in addition to providing the bias for sliding the inner jaw 8 into a closed position, also serve to bias the respective faces 14a, 14b of the slidable portion 14 against the corresponding faces 13a, 13b of the fixed portion 13 of the ring of magnetisable material so that a good contact is achieved.

It will be appreciated that the above description of the embodiment of the invention relates mainly to the design of the probe, rather than the electronic circuitry used in its operation. This electronic circuitry is conventional and for convenience of illustration only is omitted. In practice, however, the fixed portion 13 of the ring of magnetisable material could include a Hall chip which would be connected to a suitable circuit board disposed within the body 1 between the webs 16 and 17. However, the invention also extends to other types of current probe which do not utilize the Hall-effect for example, when required for use in measuring AC current, in which case the electronic circuity would not include a Hall chip.

The invention is not limited to a purely circular ring of magnetisable material and other shapes or configurations can be chosen, although it will be appreciated that the further one departs from a circular shape, the advantages referred to in the preamble become lessened.

We claim:
1. A current probe comprising:

(a) handle means having a proximal end and a distal end and defining a longitudinal direction therebetween;

(b) a first ring portion of magnetisable material fixed to the handle means with at least a major part projecting from the distal end of the handle means, said first ring portion having two end faces, said end faces being spaced apart in a direction oblique to said longitudinal direction;

(c) a second ring portion of magnetisable material, said second ring portion having two end faces spaced apart in said oblique direction and being linearly slidable in said longitudinal direction between a retracted position in which said ring portions can be located around a current-carrying electrical conductor and an extended position in which the end faces of the first ring portion mate with respective end faces of the second ring portion along a line of split oblique to said longitudinal direction to form a composite magnetisable ring surrounding said conductor for sensing the current in said conductor, said ring having a center lying outside said handle means and defining an aperture located substantially wholly outside said handle means; and, (d) damping means for damping the movement of said second ring portion to said extended position, said damping means comprising a toothed rack coupled to move with said first ring portion, and a gear engaging the rack.

2. A probe according to claim 1 in which said first and second ring portions are each part-circular and in said extended position form a circular ring.

* * * * *